United States Patent [19]

Gall et al.

[11] Patent Number: 5,391,514

[45] Date of Patent: Feb. 21, 1995

[54] LOW TEMPERATURE TERNARY C4 FLIP CHIP BONDING METHOD

[75] Inventors: Thomas P. Gall, Endwell; Anthony P. Ingraham, Endicott, both of N.Y.

[73] Assignee: International Business Machines Corporation, Armonk, N.Y.

[21] Appl. No.: 229,883

[22] Filed: Apr. 19, 1994

[51] Int. Cl.⁶ .................... H01L 21/28; H01L 21/58; H01L 21/60
[52] U.S. Cl. .................... 437/183; 437/189; 437/196; 437/209
[58] Field of Search ............. 437/183, 189, 196, 209

[56] References Cited

U.S. PATENT DOCUMENTS

| | | | |
|---|---|---|---|
| 3,678,569 | 7/1972 | Giesfeldt et al. | 29/473.1 |
| 4,806,309 | 2/1989 | Tulman | 420/562 |
| 4,857,671 | 8/1989 | Nakano et al. | 174/68.5 |
| 4,912,545 | 3/1990 | Go | 357/67 |
| 5,316,205 | 5/1994 | Melton | 228/180.21 |
| 5,328,520 | 7/1994 | Itagaki | 136/256 |

Primary Examiner—Olik Chaudhuri
Assistant Examiner—David E. Graybill
Attorney, Agent, or Firm—Richard M. Goldman

[57] ABSTRACT

A method of flip chip bonding an integrated circuit chip to a chip carrier. A high melting temperature composition, such as a binary Pb/Sn alloy, is deposited on contacts on, for example, the chip, and constituents of a low melting composition, such as Bi and Sn, are codeposited on contacts on, for example, the chip carrier. The chip and chip carrier are then heated. This causes the lower melting temperature composition, for example the Bi and Sn, to melt and form a low melting temperature alloy, such as a Bi/Sn alloy. The low melting alloy dissolves the higher melting composition, as Pb/Sn. This results in the formation of a solder bond of a low melting point third composition, such as a ternary alloy of Bi/Pb/Sn.

6 Claims, No Drawings

LOW TEMPERATURE TERNARY C4 FLIP CHIP BONDING METHOD

FIELD OF THE INVENTION

This invention relates to flip chip solder bonding of integrated circuit chips to chip carriers. More specifically, the invention relates the use of two compositions of differing melting temperatures on the integrated circuit chip and the chip carrier, with melting of one composition and solubilization of the other composition therein to form a lower melting solder bond.

BACKGROUND OF THE INVENTION

Controlled collapse chip connection (C4) or flip-chip technology has been successfully used for over twenty years for interconnecting high I/O (input/output) count and area array solder bumps on the silicon chips to the base ceramic chip carriers, for example alumina carriers. The solder bump, typically a lead/tin alloy such as 95 Pb/5 Sn alloy, or a lead/indium alloy, such as 50 Pb/50 In, provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a carrier. Typically, a malleable pad of metallic solder is formed on the semiconductor device contact site and solder joinable sites are formed on the conductors on the chip carrier. The integrated circuit chip and the chip carrier are brought into contact and heated, e.g., by radiant heating, heated nitrogen, or heated inert gas, to cause the solder bump to reflow and form a solder column. This heating is typically to about 370 degrees Centigrade for about 3 minutes for Pb/Sn solders and to about 265 degrees Centigrade for about 3 minutes for Pb/In solders.

More recently, organic substrates have been developed. These organic substrates demand lower temperatures then ceramic chip carriers. The temperatures heretofore utilized with ceramic chip carriers cause severe thermal stresses or even resin deterioration in organic substrates. Thus, a need exists for solder compositions and techniques that avoid the temperatures heretofore associated with Pb/Sn solder alloys and ceramic chip carriers.

OBJECTS OF THE INVENTION

It is a primary object of the invention to provide a solder bonding method that avoids the high temperatures heretofore associated with Pb/Sn solder alloys and ceramic chip carriers.

It is a further object of the invention to provide a solder alloy composition that forms a solder column below the high temperatures heretofore associated with Pb/Sn solder alloys and ceramic chip carriers.

SUMMARY OF THE INVENTION

These objects are attained by the method of the invention. According to the invention disclosed herein there is provided a method of flip chip bonding an integrated circuit chip to a chip carrier. According to the invention two soldering compositions are used. One is a low melting composition, and the other is a higher melting composition. The compositions are such that the components of the higher melting solder composition are soluble in the lower melting composition, forming a third composition of still lower melting temperature. One composition is applied to pads on the integrated circuit chip and the other is applied to pads on the chip carrier. The integrated circuit chip and the chip carrier are brought into contact, and the temperature of the chip and carrier are raised to the melting point of the lower melting solder composition. This causes the higher melting composition to solubilize and form a third, still lower melting temperature solder composition. This bonds the integrated circuit chip to the substrate.

In one embodiment the lower melting solder composition is a Bi/Sn binary, the higher melting solder composition is Pb/Sn binary, and the third solder composition formed thereby is a Bi/Pb/Sn ternary. The method of this embodiment comprises the steps of first depositing a binary Pb/Sn alloy on contacts on the chip, and codepositing Bi and Sn on the chip carrier. Next the chip and chip carrier are heated to cause the Bi and Sn to melt and form a low melting temperature Bi/Sn alloy, and dissolve the higher melting Pb/Sn therein. This forms a solder bond of a still lower melting point ternary alloy of Bi/Pb/Sn.

The low melting point Bi/Pb/Sn ternary alloy contains at least 50 weight % Bi, 20 weight % to 32 weight % Pb, and the balance Sn. Generally, the ternary alloy contains at least about 15.5 weight % Sn.

The bismuth/tin binary can be deposited directly on the chip carrier. Alternatively, one or more interleaved layers of Bi and one or more interleaved layers of Sn may be deposited on the chip carrier.

Other solder systems that can be used are Sn/Pb-Sn/Sb to form an Sn/Pb/Sb ternary, Sn/Pb-Sn/Ag to form an Sn/Pb/Ag ternary, and Sn/Pb-Sn/In to form an Sn/Pb/In ternary.

DETAILED DESCRIPTION OF THE INVENTION

According to the invention a C4 connection is formed by depositing constituents of a low melting temperature first solder composition onto one of an integrated circuit chip—chip carrier pair and providing constituents of a higher melting temperature second solder composition on the facing surface of the other member of the chip—chip carrier pair. The chip is placed on the carrier and both are heated to allow the low melting first composition to melt and form a low melting temperature first solder alloy. The molten first solder alloy dissolves the higher melting components to form a very low melting temperature third composition. The third composition bonds the integrated circuit chip to the substrate. This provides for a method in which after the initial solder reflow, the entire solder column has a melting point much lower then the original higher melting point solder composition in use. Thus, according to the invention a low melting point binary alloy, as Bi/Sn, dissolves a higher melting point alloy, as Pb/Sn, to form a lower melting point ternary, as Bi/Pb/Sn.

According to a preferred embodiment of the invention a C4 connection is formed by depositing a binary Pb/Sn alloy on an integrated circuit chip and either depositing a binary Bi/Sn alloy or codepositing a layered Bi/Sn deposit onto a chip carrier. The chip is placed on the carrier and heated to allow the Bi/Sn to melt and form a low melting temperature alloy. This is to a temperature of about 200° C. for at least about 1 minute. The molten Bi/Sn solder dissolves the higher melting Pb/Sn to form a very low melting point ternary alloy of Bi/Pb/Sn.

The low melting point Bi/Pb/Sn ternary alloy contains at least 50 weight % Bi, 20 weight % to 32 weight % Pb, and the balance Sn. Generally, the ternary alloy contains at least about 15.5 weight % Sn.

The bismuth/tin binary can be deposited directly on the chip carrier. Preferably, one or more interleaved layers of Bi and one or more interleaved layers of Sn may be deposited on the chip carrier. This simplifies fabrication of the chip carrier. Deposition can be by sputtering, electroplating, evaporation, or as a solder paste. Additionally, deposition of separate layers allows control of the reflow temperature of the resulting solder column by precise control of the Bi/Sn ratio in the deposit of the first solder alloy. The thickness of each layer is generally from about 1 to 4 mils.

Other solder systems that can be used are Sn/Pb-Sn/Sb to form an Sn/Pb/Sb ternary, Sn/Pb-Sn/Ag to form an Sn/Pb/Ag ternary, and Sn/Pb-Sn/In to form an Sn/Pb/In ternary.

EXAMPLES

The invention can be understood by reference to the examples below. Pb/Sn solder balls are deposited on the integrated circuit chip contacts and Sn and Bi layers are deposited onto organic chip carriers. The integrated circuit chips and the chip carriers are brought into compressive contact at the solder deposits and heated to reflow the Sn/Bi deposits and solubilize the Pb/Sn solder balls, thereby forming Pb/Sn/Bi solder columns.

In each example 97 weight percent Pb—3 weight percent Sn solder balls are deposited on contacts on integrated circuit chips, and layers of Sn and Bi are electrodeposited onto an organic chip carrier.

The Sn layers are electrodeposited from stannous fluoroborate solutions.

The Bi layers are electrodeposited from bismuth perchlorate solutions.

The layers of Bi and Sn are deposited to provide the thicknesses and weight ratios shown in Table I, Sn/Bi Deposition Parameters, below.

TABLE I

| | Sn/Bi Deposition Parameters | | | |
|---|---|---|---|---|
| Ex | Sn deposit (mm) | Bi deposit (mm) | wt % Sn | wt % Bi |
| 1 | 0.017 | 0.058 | 22.8 | 77.2 |
| 2 | 0.059 | 0.095 | 38.4 | 61.6 |
| 3 | 0.036 | 0.071 | 33.3 | 66.7 |
| 4 | 0.053 | 0.089 | 37.5 | 62.5 |
| 5 | 0.028 | 0.063 | 30.6 | 69.4 |
| 6 | 0.021 | 0.048 | 29.9 | 70.1 |

The integrated circuit chips and the substrates are then brought into compressive contact and heated by infra-red or convection or both to heat the chip and substrate in a nitrogen atmosphere with a flux to about 230 degrees Centigrade for about 4 minutes. This results in the reflow of the Sn/Bi deposit and the solubilization of the Pb/Sn solder balls therein, to thereby form solder columns.

The resulting solder columns have the compositions and melting temperatures shown in Table 2, Ternary Solder Compositions and Melting Temperatures, below.

TABLE 2

| Ternary Solder Compositions and Melting Temperatures | | | |
|---|---|---|---|
| Ex | Melting Point (degrees C.) | Weight % Bi | Weight % Pb | Weight % Sn |
| 1 | 95 | 52.5 | 32.0 | 15.5 |
| 2 | 97 | 50.0 | 18.8 | 31.2 |
| 3 | 98 | 50.0 | 25.0 | 25.0 |
| 4 | 100 | 50.0 | 20.0 | 30.0 |
| 5 | 109 | 50.0 | 28.0 | 22.0 |
| 6 | 123 | 46.1 | 34.2 | 19.7 |

According to the method of the invention there is provided a solder bonding method that avoids the high temperatures heretofore associated with Pb/Sn solder alloys and ceramic chip carriers.

Further, according to the invention there is provided a solder alloy composition that forms a solder column below the high temperatures heretofore associated with Pb/Sn solder alloys and ceramic chip carriers.

While the invention has been described with respect to certain preferred embodiments and exemplifications, it is not intended to limit the scop of the invention thereby, but solely by the claims appended hereto.

We claim:

1. A method of flip chip bonding an integrated circuit chip to a chip carrier comprising the steps of: depositing a first, high melting temperature composition on contacts of one of the chip and the chip carrier, and depositing a second, lower melting temperature composition on facing contacts of the opposite one of the chip and chip carrier; heating the chip and chip carrier to cause the lower melting temperature composition to melt and dissolve the higher melting temperature composition therein to form a third, still lower melting temperature composition and a solder bond of a low melting point alloy and form a third, lower melting temperature, and dissolve the higher melting temperature composition therein to form a solder bond of a low melting point alloy.

2. A method of flip chip bonding an integrated circuit chip to a chip carrier comprising the steps of: depositing a binary Pb/Sn alloy on contacts on the chip, and codepositing Bi and Sn on the chip carrier; heating the chip and chip carrier to cause the Bi and Sn to melt and form a low melting temperature Bi/Sn alloy, and dissolve the higher melting Pb/Sn therein to form a solder bond of a low melting point ternary alloy of Bi/Pb/Sn.

3. The method of claim 2 wherein the low melting point ternary alloy of Bi/Pb/Sn comprises at least 50% Bi, 20% to 32% Pb, and balance Sn.

4. The method of claim 3 wherein the low melting point ternary alloy of Bi/Pb/Sn comprises 50 to 52.5 weight% Bi, 20% to 32 weight % Pb, balance at least about 15.5 weight % Sn.

5. The method of claim 2 comprising depositing a binary Bi/Sn alloy on the chip carrier.

6. The method of claim 2 comprising depositing a layer of Bi and a layer of Sn on the chip carrier.

* * * * *